(12) United States Patent
Taylor

(10) Patent No.: US 7,397,653 B2
(45) Date of Patent: Jul. 8, 2008

(54) INVERTER DESIGN

(75) Inventor: Bill Taylor, Bend, OR (US)

(73) Assignee: PV Powered, Inc., Bend, OR (US)

( * ) Notice: Subject to any disclaimer, the term of this patent is extended or adjusted under 35 U.S.C. 154(b) by 0 days.

(21) Appl. No.: 11/400,776

(22) Filed: Apr. 7, 2006

(65) Prior Publication Data
US 2006/0250760 A1 Nov. 9, 2006

Related U.S. Application Data

(60) Provisional application No. 60/669,487, filed on Apr. 7, 2005.

(51) Int. Cl.
H02B 1/00 (2006.01)
F28F 7/00 (2006.01)
H05K 7/20 (2006.01)

(52) U.S. Cl. ............ 361/676; 361/600; 361/690; 361/697; 361/103; 307/147; 307/150; 307/151; 363/134; 363/141

(58) Field of Classification Search ............ 361/103, 361/622, 609, 625, 679, 714, 717–721, 727, 361/807–809, 823, 728–733, 744; 174/15 R, 174/16 R, 50; D13/119, 123, 124, 162; 307/147, 307/150, 151; 318/778; 363/141, 134
See application file for complete search history.

(56) References Cited

U.S. PATENT DOCUMENTS

| 4,620,263 | A | * | 10/1986 | Ito | 361/690 |
| 4,769,557 | A | * | 9/1988 | Houf et al. | 307/147 |
| 5,091,823 | A | * | 2/1992 | Kanbara et al. | 361/697 |
| 5,170,336 | A | * | 12/1992 | Getter et al. | 363/141 |
| 5,947,289 | A | * | 9/1999 | Stridsberg et al. | 206/446 |
| 5,949,640 | A | * | 9/1999 | Cameron et al. | 361/600 |
| 6,046,921 | A | * | 4/2000 | Tracewell et al. | 363/141 |
| 6,101,073 | A | | 8/2000 | Takehara | |
| 6,201,180 | B1 | | 3/2001 | Meyer et al. | |
| 6,320,769 | B2 | | 11/2001 | Kurokami et al. | |
| 6,320,776 | B1 | * | 11/2001 | Kajiura et al. | 363/141 |
| D455,399 | S | * | 4/2002 | Imamura et al. | D13/110 |
| 6,593,520 | B2 | | 7/2003 | Kondo et al. | |
| 6,713,890 | B2 | * | 3/2004 | Kondo et al. | 290/40 B |
| 6,750,391 | B2 | | 6/2004 | Bower et al. | |
| 6,803,515 | B2 | | 10/2004 | Itoyama et al. | |
| 6,812,396 | B2 | | 11/2004 | Makita et al. | |
| 6,856,497 | B2 | * | 2/2005 | Suzui et al. | 361/42 |
| 6,897,370 | B2 | | 5/2005 | Kondo et al. | |
| 6,980,450 | B2 | * | 12/2005 | Bhate et al. | 363/134 |
| 2001/0023703 | A1 | | 9/2001 | Kondo et al. | |
| 2002/0085325 | A1 | | 7/2002 | Suzui et al. | |
| 2002/0105765 | A1 | | 8/2002 | Kondo et al. | |
| 2002/0186020 | A1 | | 12/2002 | Kondo et al. | |
| 2002/0195138 | A1 | | 12/2002 | Itoyama et al. | |
| 2003/0067723 | A1 | | 4/2003 | Suzui et al. | |

(Continued)

FOREIGN PATENT DOCUMENTS

DE 10323982 A1 * 12/2004

Primary Examiner—Michael V Datskovskiy
(74) Attorney, Agent, or Firm—Perkins Coie LLP

(57) ABSTRACT

An inverter component layout and mounting bracket are disclosed which allow for electrical components, or the inverter as a whole to be replaced easily in the field. The disclosed mounting bracket and component layout also improve the heat rejection properties of the inverter.

11 Claims, 3 Drawing Sheets

U.S. PATENT DOCUMENTS

2003/0075211 A1 4/2003 Makita et al.
2003/0111103 A1 6/2003 Bower et al.
2005/0045224 A1 3/2005 Lyden
2006/0120001 A1* 6/2006 Weber et al. ................ 361/103

* cited by examiner

INVERTER DESIGN

RELATED APPLICATIONS

This application claims priority under 35 U.S.C. § 119(e) to U.S. Provisional Patent Application No. 60/669,487 which was filed on Apr. 7, 2005 and is included herein by reference. Co-pending patent application Ser. No. 11/187,059 is incorporated herein by reference.

FIELD OF THE INVENTION

The invention relates to the physical and electromagnetic design of an inverter.

BACKGROUND OF THE INVENTION

The solar energy industry is expanding at a rapid pace. Much of that expansion is due to increases in residential and small commercial photovoltaic (PV) installations. Increasingly these installations are directly connected to the utility grid without the use of batteries. Inverters are the power electronics equipment that converts DC electricity produced by PV panels (collectively a PV array) into AC required by the grid.

An inverter can be a complex device, difficult to install and repair. An inverter is often heavy and can be difficult to hold in place while mounting on a wall. An inverter can contain many components, which are often tightly packed within an enclosure. With such an inverter, field servicing is impractical and shipping the inverter to a service center is required, resulting in many days or weeks with the inverter out of service.

It would be advantageous to provide an inverter that is easy to mount on a wall and which is easy to service in the field.

SUMMARY OF THE INVENTION

An inverter is herein disclosed that makes use of a very small number of discreet components that are laid out within an enclosure to facilitate field replacement of any of the components. Further disclosed is a mounting bracket that allows for easy and accurate mounting of the inverter and provides an air gap behind the inverter to aid in cooling.

Additional features and advantages according to the invention in its various embodiments will be apparent from the remainder of this disclosure.

BRIEF DESCRIPTION OF THE DRAWINGS

Features and advantages according to embodiments of the invention will be apparent from the following Detailed Description taken in conjunction with the accompanying drawings, in which.

DETAILED DESCRIPTION OF THE DRAWINGS

An innovative inverter deign is disclosed herein which allows for field servicing of the inverter. A mounting bracket deign is disclosed herein which allows for easy wall mounting of the inverter. The description of specific embodiments herein is for demonstration purposes and in no way limits the scope of this disclosure to exclude other not specifically described embodiments of the present invention.

Figure 1:
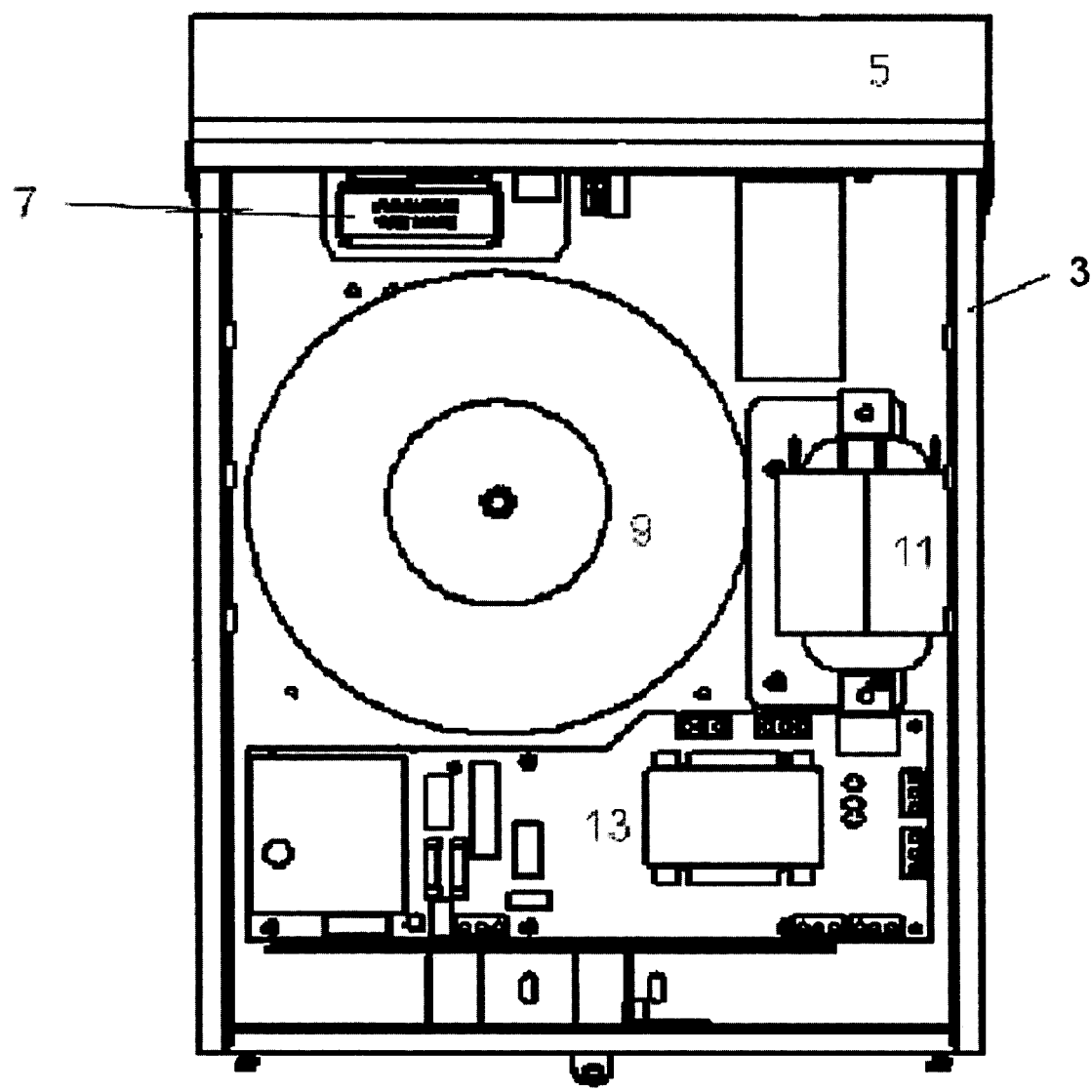
FIG. 1 shows a component layout within an inverter enclosure according to embodiments of the present invention.

FIG. 1 shows the component layout in an inverter 1. An inverter enclosure 2 has three principle parts; a chassis 3, a heat sink 5, and a front cover (not shown). The chassis 3 provides mounting structures for inverter components and encloses 4 sides of the enclosure 2. A heat sink 5 covers the top side of the enclosure 2 where it is ideally suited to disperse heat from the enclosure 2 as heat from all components within the enclosure 2 will rise to the top. In one embodiment, an inverter 1 of the present invention requires no fan or external air to provide cooling due to the efficiency of heat rejection provided by the herein disclosed layout and mounting bracket. The front cover (not shown) can be opened or optionally removed to provide access to all inverter components. When closed, the front cover may be optionally locked.

An inverter 1 consists of many electrical components that electrically interact with each other. In embodiments of the present invention, these components have been consolidated into four discreet subassemblies which only require mounting within the enclosure 2 and electrical connection between subassemblies in order to assemble the inverter 1 during manufacture. During field servicing these subassemblies are mounted such that each individual subassembly may be removed and replaced without removing any of the other subassemblies. In this way a service technician can repair the inverter 1 in less than an hour while the inverter remains installed (though power to the inverter 1 should be disconnected during servicing).

Four subassemblies according to embodiments of the present invention include:

1. A control circuit board 7 which contains a digital signal processor, a transistor module, and various circuits for sensing and controlling aspects of the inverter as appropriate to the specific inverter design. A transistor module may optionally be directly thermally connected to the heat sink 5, improving heat rejection from the transistor module. In one embodiment, the control circuit board is fastened to the enclosure 2 with six screws.

2. An isolation transformer 9 that electrically isolates power electronics within the inverter 1 from a utility grid. The transformer 9 may also act to step up or step down an AC voltage produced by inverter power electronics. The transformer 9 may be a toroidal transformer as shown in FIG. 1 or of any other transformer geometry as could be selected by one skilled in the art. In one embodiment, the transformer 9 is mounted to the enclosure 2 using a single bolt.

3. An in-line inductor 11 that improves power quality of an AC electrical output from the inverter. The inductor 11 may have windings of both ac lines on it to condition both lines with a single device. The inductor 11 may optionally have a core made of met glass. In one embodiment, the inductor 11 is mounted to the enclosure 2 using two bolts.

4. A power circuit board 13 which contains all AC and DC connections with outside power sources, circuitry for monitoring power AC and DC electrical parameters, a power supply for powering various low voltage DC devices, switches for connecting and disconnecting power sources, and other circuitry that is appropriate to the specific inverter design. In one embodiment, the power circuit board 13 is mounted to the enclosure using eight screws.

Each of these four major components is laid out according to the present invention such that installation or removal of any one part does not require any of the other parts to be removed. This is accomplished by having a small number of sub-assemblies, having a sufficiently large enclosure 2, providing access to the enclosure 2 across its entire face, installing no component 'in front' of another, providing access to fasteners and electrical connections from the front, and not blocking access to one component's fasteners or electrical connections with another component.

After the four major subassemblies have been mechanically installed in the chassis, it is necessary to wire the components together. The wiring should be designed to minimize the number of electrical connections between the major subassemblies. Wiring may be facilitated by providing color coded wires, quick connect wiring lugs, or wiring harnesses. Components within a subassembly should be permanently wired at the factory so that no wiring of components smaller than the four subassemblies is necessary during field assembly and servicing of the inverter.

Figure 2:
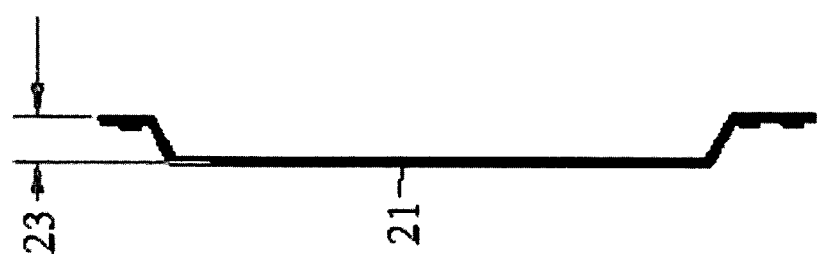
FIG. 2 shows a mounting bracket in an edge-on view according to embodiments of the present invention.

FIG. 2 shows a mounting bracket 21 according to embodiments of the present invention from an edge-on view. The mounting bracket 21 is designed to be fastened to a wall on the left hand side of the mounting bracket 21 as shown in FIG. 2 (the back of the bracket) and an inverter 1 is mounted on the right hand side of the mounting bracket 21 as shown in FIG. 2 (the front of the bracket). FIG. 2 shows that the mounting bracket 21 is designed to create a space 23 (optionally around an inch) between the wall and the inverter 21. The space 23 allows air to circulate behind the inverter 1 which aids in cooling the inverter 1.

Figure 3:
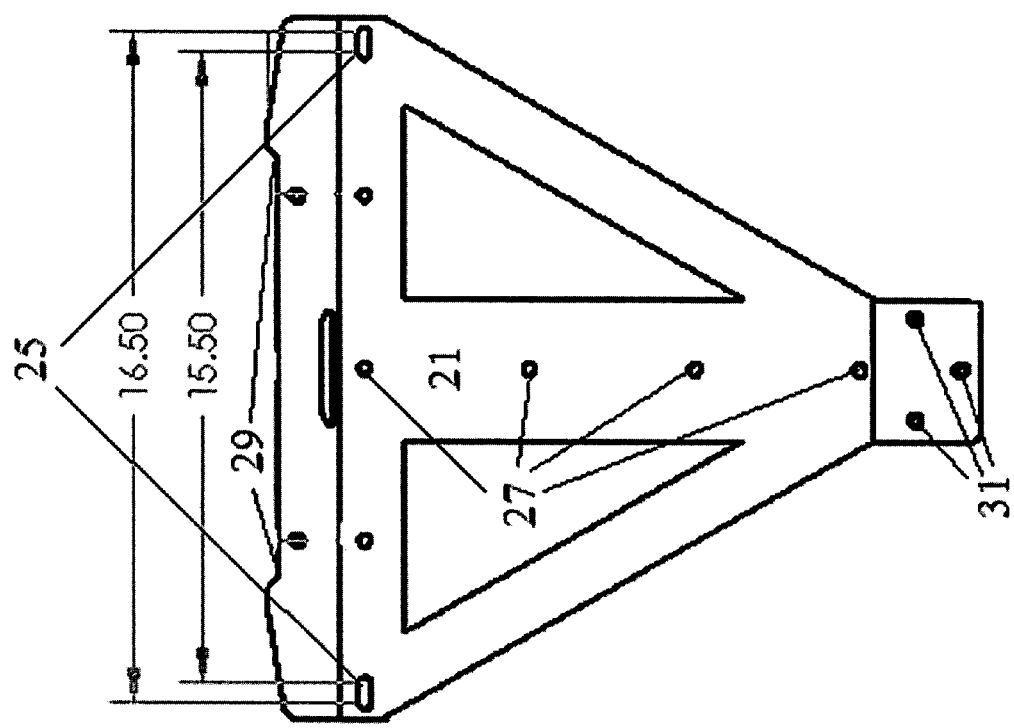
FIG. 3 shows a mounting bracket in a plan view according to embodiments of a present invention

FIG. 3 shows a mounting bracket 21 in a plan view according to embodiments of the present invention. The mounting bracket 21 of the present invention has two ways in which it may be fastened to a wall. Elongated holes 25 allow for the bracket to be mounted with lag bolts or other fastener to two studs spaced between 15.5 inches and 16.5 inches apart in a wall. Other spacing of the elongated holes 25 may be used without departing from the scope of the present invention. Standard construction practice in the United States commonly spaces studs within walls 16 inches apart. By attaching the inverter mounting bracket 21 to two separate studs, a more secure attachment is achieved than by attaching to a single stud as is common with prior art mounting brackets. Vertical mounting holes 27 allow the mounting bracket 21 of the present invention to be attached to a single stud or post if that is desirable in a particular installation. The mounting bracket 21 has a cutout 29 that is recessed from a horizontal bar at the top of the bracket. There are three threaded securing holes 31 (optionally PEM nuts) at the bottom of the mounting bracket 21.

Figure 4:
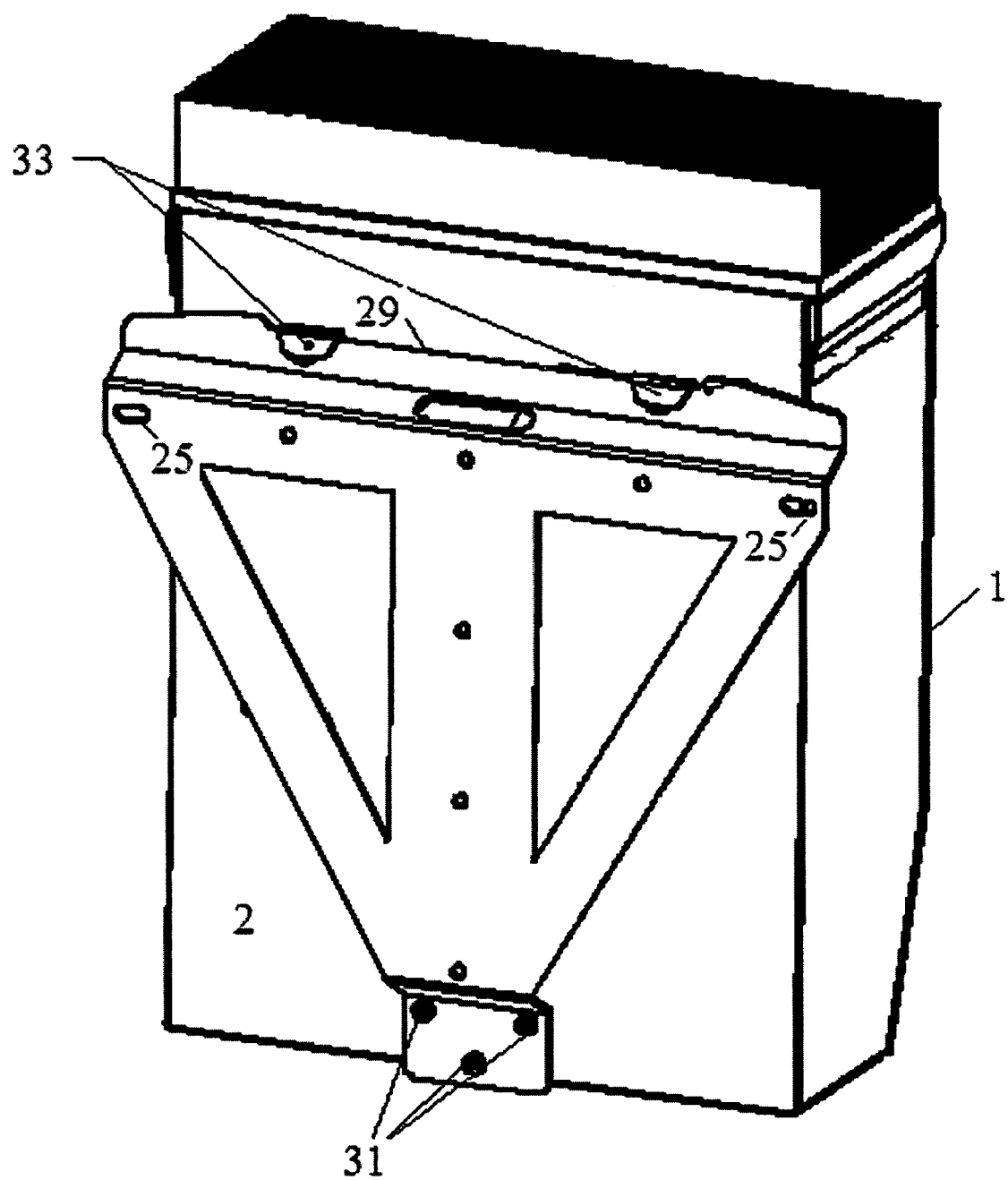
FIG. 4 shows a mounting bracket and an inverter according to embodiments of the present invention

FIG. 4 shows an inverter 1 mounted to the mounting bracket 21 according to embodiments of the present invention. The perspective in FIG. 4 is from the direction of a wall to which the mounting bracket 21 is attached. An inverter 1 is mounted to the mounting bracket 21 after the mounting bracket 21 is attached to a wall. Tabs 33 may be provided on the back of the inverter 1 to be latched into the cutout 29 of the mounting bracket 21 during installation of the inverter 1. The tabs 33 on the back of the inverter 1 are bent in a way that allows the inverter 1 to be set down on the mounting bracket 21 at up to a 20 degree angle which makes the inverter 1 easier to install. The cutout 29 and tabs 33 are shaped such that the inverter 1 will slide into the correct position if placed in approximately the correct location. If an installer misses the correct location by a larger margin, the inverter 1 will still hang on the mounting bracket 21 by only one tab 33, thereby relieving the installer of the weight of the inverter 1. In this case, the inverter 1 will not be level and it will be clear to the installer that the inverter 1 needs to be moved laterally on the bracket to get to the correct location. The inverter 1 can be slid along the bracket to minimize lifting needed for installation. Securing bolts (not shown) are passed through holes in the inverter chassis 3 from the inside and fastened to the securing holes 31 at the bottom of the mounting bracket 21. It is important to ensure that the holes in the chassis to accommodate bolts for securing holes 31 are not obscured by any of the components or subassemblies in the inverter.

The mounting bracket 21 is used to aid installers of the inverter 1 by allowing the locating, drilling, and screwing to mount the inverter to be done without the extra weight of the inverter 1 present. An inverter 1 may weigh in excess of 150 pounds. The mounting bracket 21 is installed and then the inverter 1 is hung on the mounting bracket making the installation quicker and less strenuous. Furthermore, replacement of an inverter 1 is made easier since all that is required is that the inverter be disconnected electrically and the three securing bolts be removed and an inverter can be removed and/or replaced.

Disclosed is an inverter 1 and mounting bracket 21 which provide an inverter 1 which is much more easily installed and serviced than prior art inverters. Individual inverter electrical components are accessible for quick field replacement and the inverter 1 as a whole is easily mounted or dismounted from its mounting bracket 21. Thus, any electrical part of the inverter or the inverter 1 as a whole need only have electrical connections and a small number of fasteners disconnected and the part or the inverter 1, or the whole inverter 1 can be removed and replaced in the field. The disclosed mounting bracket 21 and component layout have the further advantage of providing efficient heat rejection from the inverter.

While an embodiment of the invention has been shown and described, it will be apparent to those skilled in the art that various modifications may be made without departing from the scope of the invention. Therefore, it is intended that the invention not necessarily be limited to the particular embodiments described and illustrated herein.

What is claimed is:

1. An inverter connected to a photovoltaic panel comprising:
a chassis with a top, a bottom, two sides, a front, and a back; and
inverter circuitry with individual components grouped in four subassemblies that are fastened individually to the chassis wherein each subassembly can be removed and replaced without removing any other subassembly or component such that the inverter can be quickly serviced in the field.

2. The inverter of claim 1 wherein the subassemblies comprise a control circuit, an isolation transformer, an inductor, and a power circuit.

3. The inverter of claim 2 wherein the components that comprise each subassembly are permanently wired and wherein wiring between subassemblies is designed to facilitate quick wiring of subassemblies to each other.

4. The inverter of claim 1 further comprising a heat sink on the top of chassis and where the subassemblies are fastened to the chassis in an arrangement that facilitates heat transfer through the heat sink and eliminates a need for a fan or external air.

5. An inverter connected to a photovoltaic panel comprising:
a chassis with a top, a bottom, two sides, a front, and a back that holds the inverter's electrical components;

a mounting bracket that attaches to a wall or a post and includes a horizontal top bar at a top of the bracket; and a structure for removably fastening the back of the chassis to the mounting bracket that includes tabs fastened to the back of the chassis that hang on the bar to support the weight of the inverter.

6. The inverter of claim 5 wherein the mounting bracket is adapted to space the inverter from the wall or post to which it is attached by a distance that is sufficient to facilitate air flow across the back of the chassis whereby heat transfer is facilitated.

7. The inverter of claim 5 wherein the mounting bracket is adapted to be fastened to either a single wall stud or post or to two spaced wall studs.

8. The inverter of claim 7 wherein the mounting bracket has mounting holes that are aligned vertically to facilitate attachment to a single stud or post and also has holes that are aligned horizontally to facilitate attachment to two horizontally spaced studs.

9. The inverter of claim 5 wherein the horizontal bar comprises a recessed cutout that locates the tabs such that the inverter is centered laterally relative to the mounting bracket.

10. The inverter of claim 5 wherein the bracket comprises threaded holes at the bottom of the bracket that accept bolts to secure the inverter to the mounting bracket.

11. The inverter of claim 5 wherein electrical components are arranged in the chassis to allow free access to holes in the chassis through which bolts are passed to secure the inverter to the mounting bracket.

* * * * *

UNITED STATES PATENT AND TRADEMARK OFFICE
CERTIFICATE OF CORRECTION

PATENT NO. : 7,397,653 B2 Page 1 of 1
APPLICATION NO. : 11/400776
DATED : July 8, 2008
INVENTOR(S) : Taylor It is certified that error appears in the above-identified patent and that said Letters Patent is hereby corrected as shown below:

In column 1, line 59, after "invention" insert -- . --.

In column 1, line 61, after "invention" insert -- . --.

In column 4, line 34, delete "inverter." and insert -- inverter 1. --.

Signed and Sealed this

Fourth Day of November, 2008

JON W. DUDAS
*Director of the United States Patent and Trademark Office*